United States Patent
Boote et al.

(10) Patent No.: US 8,924,076 B2
(45) Date of Patent: Dec. 30, 2014

(54) INTERACTIVE VEHICLE GLAZING

(75) Inventors: Joe Boote, St. Helens (GB); Neil Barton, St. Helens (GB); Steve Day, St. Helens (GB); Ashley Torr, St. Helens (GB); Carl Pickering, Kenilworth (GB); Peter Thomas, Leics (GB)

(73) Assignees: Pilkington Group Limited, St. Helens, Merseyside (GB); Pilkington Automotive Limited, St. Helens, Merseyside (GB); Ford Global Technologies, LLC, Dearborn, MI (US)

( * ) Notice: Subject to any disclaimer, the term of this patent is extended or adjusted under 35 U.S.C. 154(b) by 915 days.

(21) Appl. No.: 12/531,633

(22) PCT Filed: Mar. 13, 2008

(86) PCT No.: PCT/GB2008/000869
§ 371 (c)(1),
(2), (4) Date: Mar. 12, 2010

(87) PCT Pub. No.: WO2008/113978
PCT Pub. Date: Sep. 25, 2008

(65) Prior Publication Data
US 2010/0179725 A1 Jul. 15, 2010

(30) Foreign Application Priority Data
Mar. 16, 2007 (GB) .................................. 0705120.4

(51) Int. Cl.
G06F 7/00 (2006.01)
B32B 17/10 (2006.01)
H03K 17/96 (2006.01)

(52) U.S. Cl.
CPC .. B32B 17/10036 (2013.01); *H03K 2017/9602* (2013.01); B32B 17/10174 (2013.01); *B32B 17/10* (2013.01); *H03K 17/962* (2013.01); *B32B 2605/08* (2013.01); *H03K 2217/960755* (2013.01)
USPC .......................................................... 701/36

(58) Field of Classification Search
None
See application file for complete search history.

(56) References Cited

U.S. PATENT DOCUMENTS 6,617,975 B1 * 9/2003 Burgess ................... 340/815.47
6,654,070 B1 * 11/2003 Rofe ............................... 349/11

(Continued)

FOREIGN PATENT DOCUMENTS

EP 0146198 A2 6/1985
GB 2090979 A 7/1982

(Continued)

OTHER PUBLICATIONS

International Search Report for PCT/GB2008/000869 completed Jun. 24, 2008.

(Continued)

*Primary Examiner* — Paul Danneman
(74) *Attorney, Agent, or Firm* — Buchanan Ingersoll & Rooney PC (57) ABSTRACT

A laminated vehicle glazing comprising: at least two glazing panes laminated together by at least one interlayer therebetween; at least one sensor which is manually operable by the presence of a user's hand contacting or proximal to at least one of the panes; at least one shield associated with the at least one sensor whereby the at least one sensor is manually operable by the presence of a user's hand from only one side of the vehicle glazing; and at least one connector electrically connected to the at least one sensor connectable to an external device for control of the external device by manual operation of the at least one sensor.

30 Claims, 7 Drawing Sheets (56) References Cited

U.S. PATENT DOCUMENTS

| | | | |
|---|---|---|---|
| 7,745,838 B2* | 6/2010 | Lefevre | 257/88 |
| 2005/0001456 A1 | 1/2005 | Bohm et al. | |
| 2005/0088079 A1* | 4/2005 | Daniels | 313/504 |
| 2005/0238857 A1 | 10/2005 | Day | |
| 2006/0025897 A1* | 2/2006 | Shostak et al. | 701/1 |
| 2006/0275599 A1 | 12/2006 | Lefevre | |

FOREIGN PATENT DOCUMENTS

| | | |
|---|---|---|
| GB | 2423808 A | 9/2006 |
| JP | H02-117414 A | 5/1990 |
| JP | H09-109802 A | 4/1997 |
| JP | 2004-169435 A | 6/2004 |
| WO | WO 99/58795 A1 | 11/1999 |
| WO | WO 2004/009349 A1 | 1/2004 |
| WO | WO 2004/016897 A2 | 2/2004 |
| WO | WO 2004/062908 A2 | 7/2004 |

OTHER PUBLICATIONS

Written Opinion for PCT/GB2008/000869 completed Jun. 24, 2008.
United Kingdom Search Report for GB0705120.4 completed Nov. 21, 2007.
Chinese Office Action issued Jun. 11, 2012 by The People's Republic of China Patent Office in Chinese Application No. 200880013970.8 and partial English translation of text portion of Office Action.
Japanese Notification of Reasons for Refusal dated Feb. 5, 2013 issued in the corresponding Japanese Patent Application No. 2009-553205 and English-language translation (7 pages).

* cited by examiner

INTERACTIVE VEHICLE GLAZING

The present invention relates to a laminated vehicle glazing suitable for fitting in a vehicle, especially for fitting as a window in the bodywork of a vehicle.

Modern vehicles, especially automotive vehicles, are commonly equipped with a number of functional elements. Examples of functional elements include items such as a heater for a windshield and/or a rear window, wipers and washers for a windshield and/or a rear window, air conditioning and seat heating, to name but a few. Each of these functional elements requires control, e.g. in the form of an on/off switch, and so located somewhere in the vehicle there will usually be one or more control panels with switches and the like to control the particular functional elements found on/in the vehicle. The control panels are usually located on and around the vehicle's dashboard, where they are readily accessible by the driver of the vehicle.

With advancement of technology, the number of functional elements in a typical vehicle has increased over recent years, and is set to increase yet further in the future. Correspondingly, the number of controls and control panels for these functional elements is also on the increase, often with the unfortunate result that the dashboard of a typical vehicle is littered with controls; this may be a cause of distraction for the driver of the vehicle as he/she tries to locate a particular control.

Furthermore, many of the functional elements in a modern vehicle are meant to be accessible by all occupants of the vehicle and not just the driver. However, because most controls are located so as to be readily accessible by the driver, this usually means that they are less accessible, if accessible at all, to the other occupants of the vehicle. Moreover many, if not all, of the controls for the functional elements on/in a vehicle are only accessible from within the vehicle. This may be inconvenient to a vehicle user if the functional element which is sought to be controlled, e.g. the vehicle bonnet release mechanism, is located in the interior of the vehicle, and its associated vehicle part, e.g. the vehicle bonnet, is located on the exterior of the vehicle, as this will often mean that the user must get into the vehicle to access the control and then get out of the vehicle to access the associated vehicle part.

It is known to provide a control for a functional element in an alternative location on/in a vehicle, namely by providing the control as part of a window glazing for the vehicle. JP-A-2004-169435 discloses an immovable vehicle window panel which has a pressure sensitive "touch panel" formed on, or attached to, one of its surfaces. The touch panel can control, for example, the locking and unlocking of the vehicle doors. A printed display is also provided on the window panel, defining the touch panel. When the touch panel is touched, two otherwise spaced and mutually insulated, electrically conductive layers are brought into contact with each other; the electrical contact is detected by control electronics, which is remote from the window panel. The main disadvantage with the window panel of JP-A-2004-169435 is that the touch panel is provided on the outer surface of the window, where it is exposed to the external environment surrounding a vehicle into which it may be fitted and thus subject to degradation and weathering. Additionally it is unsatisfactory because it is immovable, i.e. it is a non-opening window, because otherwise the exposed touch panel would degrade and wear with repeated opening and closing of the window.

WO-A-2004/062908 discloses a laminated window having electronic components, such as light emitting diodes ("LEDs"), photodiodes, vision sensors, etc., inserted within it. In one embodiment, an array of twelve LEDs is laminated in a vehicle windshield. Power to the LEDs is provided by an electrically conductive coating within the laminate. The LEDs may function as signalling means, e.g. to signal that the vehicle's alarm has been activated, as lighting means, e.g. as ambient light for the vehicle's interior, or as communication means, e.g. an infrared transmitter to open a garage door. The LEDs are turned on and off via a capacitive switch, the interaction-electrode of which is formed from the electrically conductive coating which provides power to the LEDs. This application is solely concerned with provision of a functional electronic component and its control within a window. The electronic components disclosed are typical of the types that are included within laminates (it is well-known, e.g. from WO-A-2004/009349, to laminate LEDs), so the further teaching in WO-A-2004/062908 is limited to also providing the switch which controls an electronic component within the laminate.

WO-A-99/58795 teaches a single pane glazing having a tap-sensitive keypad provided on one of its surfaces, along with a lighting mechanism and possibly a further sensory feedback mechanism. The keypad comprises a vibration-response or capacitive sensor to provide a signal, e.g. the locking/unlocking mechanism of a vehicle door, and a printed icon to define the keypad itself. The lighting mechanism is provided to illuminate the keypad, and this or the further sensory feedback mechanism for provision of sensory feedback when the sensor has been activated. Such a panel is however unsatisfactory because the elements comprised in the keypad are exposed to the ambient environment surrounding a vehicle into which the glazing may be fitted. Such exposure means that these elements are at an increased risk of damage, such that the working lifetime of such a panel would be drastically reduced.

It would thus be desirable to provide a vehicle glazing as an alternative location for the controls of the functional elements found on/in a vehicle and to protect the controls from potentially damaging environmental effects surrounding a vehicle. Furthermore it would be desirable to reduce the number of controls located on the dashboard of a vehicle and thus to reduce the risk of driver distraction, to make the controls more accessible to the other occupants of the vehicle, and also to make the controls accessible from either the interior or the exterior of the vehicle.

Accordingly the present invention provides a laminated vehicle glazing comprising: at least two glazing panes laminated together by at least one interlayer therebetween; at least one sensor which is manually operable by the presence of a user's hand contacting or proximal to at least one of the panes; at least one shield associated with the at least one sensor whereby the at least one sensor is manually operable by the presence of a user's hand from only one side of the vehicle glazing; and at least one connector electrically connected to the at least one sensor and connectable to an external device for control of the external device by manual operation of the at least one sensor.

The laminated vehicle glazing may further comprise a visual indicator to indicate the location of the at least one sensor and/or the function of the external device; and at least one electrical illumination device, laminated between the at least two glazing panes, adapted to illuminate the visual indicator and/or to indicate manual operation of the external device.

The present invention also provides the use of a laminated vehicle glazing in accordance with the invention as a windshield, rear window glazing, side window glazing or roof glazing of a vehicle.

The present invention further provides a motor vehicle comprising a bodywork and having fitted into the bodywork at least one laminated glazing in accordance with the invention, the vehicle further comprising control electronics for the at least one sensor and the at least one electrical illumination device.

Preferably, the at least one sensor and the at least one shield comprise a switch arrangement, with the sensor being a switch interface, adapted in use to activate/deactivate one or more external devices associated with the vehicle. Most preferably, the at least one sensor and the at least one shield form part of a capacitive circuit which in use is connected to control electronics in the vehicle for measuring a capacitive signal at the or each sensor and control the operation of the external device when a change of capacitive signal is detected. In addition, the at least one connector may be arranged between two guard electrodes in such a way that no change in the capacitive signal can be detected at the at least one connector.

The present invention yet further provides a laminated vehicle glazing comprising: at least two glazing panes laminated together by at least one interlayer therebetween; at least one sensor which is manually operable by the presence of a user's hand contacting or proximal to at least one of the panes; at least one connector electrically connected to the at least one sensor and connectable to an external device for control of the external device by manual operation of the at least one sensor; a visual indicator to indicate the location of the at least one sensor and/or the function of the external device; and at least one electrical illumination device, laminated between the at least two glazing panes, adapted to illuminate the visual indicator and/or to indicate manual operation of the external device, wherein the at least one sensor, the visual indicator and the at least one electrical illumination device are in registry together in a stacked configuration.

The at least one connector may extend to an edge of the vehicle glazing.

The visual indicator may comprise at least one icon on a surface of one of the panes of glazing material, which may be an outer surface or an inner surface, i.e. one facing into the laminate, or on a surface of the ply of interlayer material. The purpose of the at least one icon is to provide information to a user of a vehicle into which such a glazing may be fitted regarding the nature and location of the sensor and the one or more external devices, constituting functional elements, it is adapted to control. Preferably the sensor is configured to enable activation/deactivation of a single functional element, and so will have an icon representative of that element and a single electrical illumination device to indicate its activation/deactivation.

The at least one sensor may comprise at least two sensors configured to enable activation/deactivation of at least two different functional elements. Whichever direction the at least two sensors are made to face, interaction with each of them by a vehicle user may be indirect when they are provided within the laminate (each switch interface working on the principle of electrical capacitance between the user of the switch arrangement, the glazing, the vehicle and the surrounding air).

Two or more switch arrangements may be provided in a laminate such that one or more of them is made to face into a vehicle and one or more made to face out of the vehicle. Preferably a pair of oppositely facing switch interfaces lies in register with one another (i.e. they are opposed in the laminate). Each opposed switch interface may be configured to enable activation/deactivation of the same functional element so that it may be dually controlled from both inside and outside the vehicle, or different functional elements which may be solely controlled from either inside or outside the vehicle. Having a functional element controlled solely from inside the vehicle (by configuring a switch interface to be operable from inside the vehicle only) may be especially useful for avoidance of accidental activation/deactivation of the switch interface, e.g. by raindrops or a person wiping the glazing when cleaning the vehicle.

By providing a switch arrangement as per the invention above, the control of one or more functional elements associated with a vehicle may be removed from the dashboard of a vehicle, thereby reducing the risk of distraction for the driver of the vehicle when operating the controls in the vehicle. Additionally, such a switch arrangement may be accessed by the other users of the vehicle. It may also be accessed from the interior and/or the exterior of the vehicle.

The one or more functional elements associated with the vehicle which the switch arrangement is adapted to activate/deactivate may belong to the following non-exhaustive group: windshield heating element (for demisting and/or de-icing the windshield), windshield wipers, windshield washers, vehicle occupant's interior map/reading light, rear window sunblind, rear window heating element, door lock, boot lock and/or automatic-release mechanism, engine ignition, sun-roof open/close mechanism, sun-roof variable transmission mechanism, climate control system, air conditioning, fuel filler cap release, seat heater, side window sunblind, rear seat occupant's entertainment controls (e.g. for in-vehicle TV and/or DVD systems), interior light, in-vehicle telematics (e.g. GPS) and the like.

The panes of glazing material comprised in the glazing may be made from glass, e.g. a conventional soda-lime-silica glass, or a rigid plastics material, e.g. polycarbonate. The two panes may be made of the same material or one may be glass and one may be plastics. If made from glass, one or both may be a toughened safety glass. The panes may be flat or they may have some degree of curvature. Regarding the transparency of the panes, one or both may be clear or body-tinted. Furthermore, a functional coating such as a solar control coating may be provided on a surface of at least one of the panes. Typically the panes of glazing material are used in a thickness between 1 and 10 mm, preferably between 1.5 and 6 mm.

The ply of interlayer material may be a flexible plastics material, which may be clear or body-tinted. Suitable interlayer materials include polyvinyl chloride (PVC), polyurethane (PU), ethyl vinyl acetate (EVA), polyethylene terephthalate (PET) and polyvinyl butyral (PVB), the most common choice for laminate currently being PVB. A sheet of PVB in 0.76 mm thickness may typically be used, although 0.38 mm thickness may also be used.

The switch arrangement may comprise a plurality of switch interfaces, which form a keypad for causing activation/deactivation of a functional element when a predetermined combination of keystrokes is entered onto it. Preferably, the keypad is alpha-numeric to increase the number of possible combinations of keystrokes that may be entered to get the combination correct.

The or each switch interface (as appropriate) may be provided between the panes of glazing material, i.e. within the laminate. Further preferably the or each switch interface may be provided on a surface of the ply of interlayer material. However, the or each switch interface may alternatively be provided on a surface of one of the panes of glazing material.

The or each switch interface may be in the form of an area or patch of an electrically conductive coating, which is preferably transparent. Advantageously, the electrically conductive coating may be provided on a ply of PET which may itself be laminated between two plies of PVB forming a composite interlayer. The coating may be attached to an electrical source to enable it to form part of the capacitive circuit discussed earlier. The coating may include a single layer of a metal or metal oxide (the latter preferably being a transparent conductive oxide). Oxides of metals such as tin, zinc, indium, tungsten and molybdenum may be comprised in the single layer of metal oxide. The coating may further comprise a dopant, for example fluorine, chlorine, antimony, tin, aluminium, tantalum, niobium, indium or gallium, so that a coating such as fluorine-doped tin oxide or tin-doped indium oxide may result.

Alternatively, the coating may comprise a multilayer coating stack which normally includes at least one metal layer or metal oxide layer and at least one dielectric layer. The multilayer stack structure may be repeated to further enhance the conductivity of the coating. Amongst other similar metals, silver, gold, copper, nickel and chromium may be used as the metal layer in a multilayer stack; indium oxide, antimony oxide or the like may be used as the metal oxide layer. Coatings comprising one or two layers of silver interleaved between layers of a dielectric such as an oxide of silicon, aluminium, titanium, vanadium, tin or zinc are typical multilayer stacks. A number of electrically conductive coatings are known in the art, any of which may be used in accordance with the invention.

The or each switch interface, provided as discrete areas of electrically conductive coating, may be formed by masking one or more selected areas on the ply of material onto which the coating is to be deposited (i.e. a pane of glazing material or the ply of interlayer material), so that when it is deposited, the one or more selected areas remain devoid of coating, producing discrete coated areas. The or each switch interface (as one or more discrete coated areas) may alternatively be formed by selective removal of the coating from the ply of material on which it has been deposited in a selected area, for example by laser ablation.

When forming part of a capacitive circuit, an electrically conductive coating is typically accessible with via both of its major surfaces, so the or each switch interface may be interacted with from both sides of the glazing. To make a switch interface accessible from one particular side of a glazing only (as discussed earlier), an electromagnetic shield may be incorporated into the glazing to inhibit capacitive interaction between a vehicle user from either inside or outside of the vehicle into which the glazing may be fitted. Preferably the shield is a driven shield, meaning that it is maintained at a voltage that is equivalent to the average voltage over the capacitive circuit, to prevent coupling of the shield to the capacitive signal. The shield may be an electrically conductive coating, preferably in the form described above.

The shield may alternatively be in the form of a non-continuous construction, for example an array of wires or conducting lines, which may, for example, comprise a fine hating wire array already present in the glazing for the additional function of heating of the laminated glazing.

When a driven shield is employed, an insulation layer is also preferably located between each electrically conductive (capacitive) area (i.e. the switch interfaces) and the driven shield layer, to maintain the electrical integrity of both the driven shield circuit and the capacitive circuit.

The or each switch interface may alternatively be in the form of a non-continuous construction, for example an array of wires or conducting lines.

The switch arrangement preferably further comprises control electronics in electrical communication with the or each switch interface. The or each switch interface may be interfaced with by a user of the vehicle (either from within the vehicle or outside it) so as to cause cooperative electrical communication with the electronics, which in turn, activates or deactivates the appropriate functional element. The electronics may be specific to a functional element to enable its activation/deactivation, or a single electronics package may be used to activate/deactivate a plurality of functional elements via known multiplexing technology.

The control electronics may preferably be hidden from the view of the vehicle user by the bodywork of the vehicle. The control electronics may thus be provided remotely from the glazing, e.g. at a location somewhere on the vehicle itself—such as on the inside of a door of the vehicle. Such location would mean that the glazing itself, having the switch arrangement located within it, is free from any appendages (other than connection to the control electronics) which may otherwise have hindered the glazing and its movement (where the glazing is a movable glazing). Additionally, hiding the control electronics may be more pleasing from an aesthetics point of view.

Preferably a switch interface is provided in register with an icon. The purpose of such an icon is to indicate to a vehicle user the location on the glazing that needs to be interfaced with in order to activate/deactivate the switch arrangement and thereby the particular functional element of which the icon is representative.

The switch arrangement may further comprise an electromagnetic radiation receiver which activates the or each switch interface when a predetermined signal transmitted from a co-operable transmitter is received by it, prior to the or each switch interface being enabled to activate/deactivate the one or more functional elements. The receiver may be operable by moving the transmitter into proximity with it, at which point the transmitted signal may be received, recognised and accepted. If so configured, the switch arrangement may not be operable if it does not receive said signal from the transmitter. The transmitted signal may effectively "wake" the or each switch interface in readiness for interfacing with by a vehicle user. Furthermore, as a security feature, only a person in possession of the transmitter may be able to interface with the switch arrangement. Once a vehicle into which a glazing according to the invention has been fitted is unlocked or has its ignition turned on however, the switch arrangement may then be enabled for use by any person (use then being independent of the receiver/transmitter functionality).

Upon a vehicle user interfacing with a switch arrangement, e.g. by touching the glazing and activating/deactivating a functional element, indication means may be activated to inform the user that the activation/deactivation was successful. The indication means may comprise a visual indicator (i.e. the vehicle user is informed of the success of his interaction with the switch arrangement visually). The visual indicator may be provided as one or more LEDs. An LED (of any colour) may be turned on to indicate activation, or a bi-colour LED may switch from one colour to the other (e.g. red to green) to indicate activation. Additionally or alternatively, the indication means may comprise a tactile indicator (i.e. the user is informed of the success of his interaction with the switch arrangement when touching the glazing). The tactile indicator may be provided as a vibrational element. Further additionally or again in the alternative, the indication means may comprise an acoustic indicator (i.e. the user is informed of the success of his interaction with the switch arrangement aurally). The acoustic indicator may comprise a speaker capable of emitting an audible alarm sound.

As with the control electronics, the indication means (other than when it comprises a visual indicator) may be hidden from the view of the vehicle user by the bodywork of the vehicle. This may mean that only the switch interface is visible to the user. Thus the indication means may be provided remotely from the glazing, e.g. along with the control electronics somewhere on the vehicle itself. In the case where the indication means is provided within the laminate, it may be necessary to include one or more (further) insulation layers in the laminate to ensure that electrical power supplied to the indication means remains electrically isolated from one or both of the capacitive circuit and the driven shield circuit (as appropriate).

The at least one electrical illumination device is preferably adapted to illuminate the or each switch interface. When the or each switch interface is provided in register with an icon, said icon may be illuminated. Such illumination may be especially useful at night-time when the icons to be interfaced with in order to activate/deactivate a functional element may be obscured or semi-obscured by darkness and so difficult to see by the vehicle user. The illumination device may be provided as one or more LEDs.

The illumination device may be activated by touching any part of the glazing (other than the or each switch interface) relative to which the switch arrangement is mounted. Advantageously, in the case where the switch arrangement comprises a receiver as discussed above, the receiver may need to receive, recognise and accept a signal from the co-operable transmitter prior to a user being able to activate the illumination means. Alternatively the illumination device may be automatically activated at the same time as the switch arrangement is awoken when a transmitted signal is received by the receiver. Once the or each switch interface has been illuminated, the icon corresponding to the desired functional element to be activated/deactivated may be selected and interfaced with, e.g. by touching it, accordingly. The illumination device may then be automatically deactivated after a predetermined period of time has elapsed. This period of time may differ depending on whether the switch arrangement has been interfaced with, or if the glazing was illuminated accidentally. If the glazing has been touched, illumination may last for a period of fifteen seconds (preferably at least ten seconds), but if a switch interface is subsequently interfaced with in this period, illumination may be automatically deactivated in response.

Activation/deactivation of a functional element associated with the vehicle may preferably be in the form of an on/off mechanism, an open/close mechanism, an increase/decrease mechanism (which may be in the form of a graduated scale), and/or other such like mechanisms as may be required. Interaction with the or each switch interface may therefore have the effect of turning on a functional element, or opening a functional element, or increasing/decreasing some quality/quantity of a functional element, etc.

In terms of operation of a switch arrangement comprised in a glazing, the switch arrangement may be arranged to face into the interior of the vehicle, for operation by an occupant of the vehicle. Alternatively the switch arrangement may be arranged to face the exterior of the vehicle, for operation by a vehicle user outside the vehicle, in which case a driven shield may preferably be included within the laminate, as discussed earlier.

The bodywork of a vehicle typically includes a number of window openings—a rear window, a front window, side windows and optionally a roof window (either in the form of a conventional sun-roof or a full-area roof). A glazing according to the invention is especially suitable for fitting into any of these openings. Furthermore two or more of the glazings to be fitted into window openings of the bodywork of a vehicle may each be provided with a switch arrangement, so that there may be a number of switch arrangements positioned around a vehicle. A glazing according to the invention is also suitable for fitting as an internal glazing panel in a vehicle, e.g. as a control panel between the front and rear seats of the vehicle.

By providing a switch arrangement in accordance with an embodiment of the present invention, the control of one or more functional elements associated with a vehicle may be reliably accessed from the interior or the exterior of the vehicle.

Figure 1:
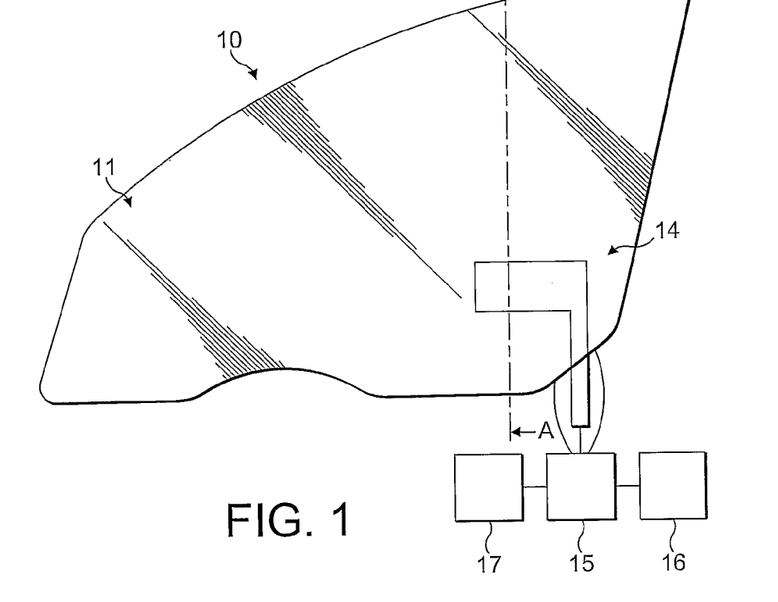
FIG. 1 is a plan view of a laminated glazing according to a first embodiment of the invention.

For a better understanding, the present invention will now be more particularly described by way of non-limiting example with reference to, and as shown in, the accompanying schematic drawings (not to scale) wherein:

FIG. 1 shows laminated glazing 10, in the form of a side window glazing, which is suitable for fitting into a side window opening in the bodywork of a vehicle, and which may be a fixed glazing or a movable glazing.

In any of the embodiments of the invention, the laminated glazing comprises at least an outer pane of glazing material and an inner pane of glazing material. Each glazing material may be in the form of a pane of glass, e.g. a conventional soda-lime-silica glass, or a rigid plastics material, e.g. polycarbonate. However, other materials are possible. The two panes may be made of the same material or one may be glass and one may be plastics. If made from glass, one or both may be a toughened safety glass. The panes may be flat or they may have some degree of curvature. Regarding the transparency of the panes, one or both may be clear or body-tinted. Typically the panes of glazing material are used in a thickness between 1 and 10 mm, preferably between 1.5 and 6 mm.

In this embodiment, laminated glazing 10 comprises outer pane of glazing material 11, in the form of a pane of glass, and switch arrangement 14, which is adapted to activate/deactivate a functional element 16 associated with the vehicle. Functional element 16 may be an item selected from the following non-exhaustive list: windshield heating element (for demisting and/or de-icing the windshield), windshield wipers, windshield washers, vehicle occupant's interior map/reading light, rear window sunblind, rear window heating element, door lock, boot lock and/or automatic-release mechanism, engine ignition, sun-roof open/close mechanism, sun-roof variable transmission mechanism, climate control system, air conditioning, fuel filler cap release, seat heater, side window sunblind, rear seat occupant's entertainment controls (e.g. for in-vehicle TV and/or DVD systems), interior light or in-vehicle telematics (e.g. GPS).

Switch arrangement 14 is electrically connected to functional element 16 via control electronics 15, the power to both of which is provided by power source 17, e.g. the vehicle's battery. Control electronics 15 is chosen to cooperate with functional element 16 from suitable electronics known in the art.

Figure 2:
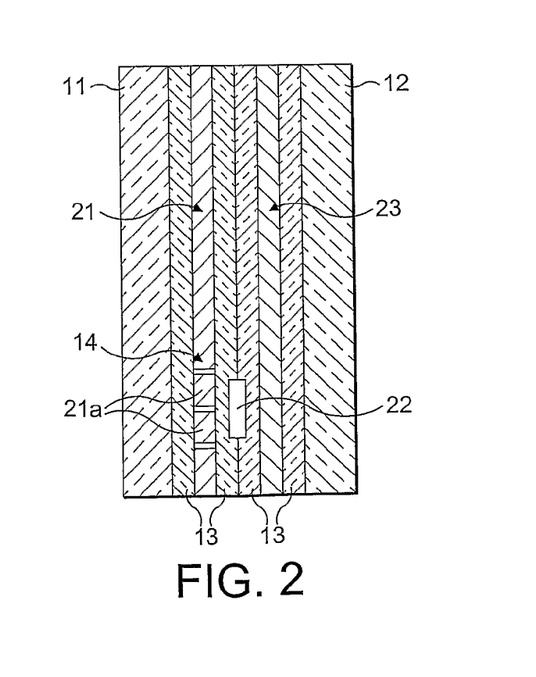
FIG. 2 is a cross section viewed along line A-A of FIG. 1.

FIG. 2 provides more detail about the construction of laminated glazing 10, which further comprises inner pane of glazing material 12, in the form of a pane of glass, joined to outer pane of glazing material 11 via plies of interlayer material 13, in the form of plies of polyvinyl butyral (PVB). Switch arrangement 14 is provided between panes of glazing material 11, 12, specifically between two of the plies of interlayer material 13. One of the plies of interlayer material 13 (the ply adjacent to outer pane of glazing material 11) is provided on its inner surface (the surface facing into the centre of glazing 10) with electrically conductive coating film 21, in the faun of a double silver layer coating on a ply of polyethylene terephthalate (PET). Selected areas of the coating have been removed to form switch interfaces 21a, in the form of discrete areas or patches of coating on the ply of PET.

The switch interfaces 21a each comprise a sensor, in the form of an electrode of a capacitive circuit, which is manually operable by the presence of a user's hand contacting or proximal to at least one of the panes.

Switch arrangement 14 comprises, in addition to switch interfaces 21a, indication means 22, in the form of an array of light emitting diodes (LEDs). Indication means 22 is provided between two plies of interlayer material 13, in register with switch interfaces 21a. Switch arrangement 14 in the embodiment of the invention shown will work in one direction only, namely from the outside of a vehicle into which glazing 10 may be fitted. Switch interfaces 21a have been made unidirectional in operation by the presence of driven shield 23 positioned between coating film 21 and inner pane of glazing material 12. Driven shield 23 is in the form of an electrically conductive coating film (double silver layer coating on a ply of PET), which inhibits capacitive interaction between a vehicle user inside the vehicle and switch interfaces 21a. The plies of interlayer material 13 electrically insulate the switch interfaces 21a from both the indication means 22 and the driven shield 23 to ensure the electrical integrity of the capacitive circuit of which switch interfaces 21a form a part, the array of LEDs and the driven shield circuit.

Both electrically conductive coatings (specifically each switch interface 21a and driven shield 23) have electrical power supplied to them, to enable them to perform their respective functions, via control electronics 15 from power source 17.

Figure 3:
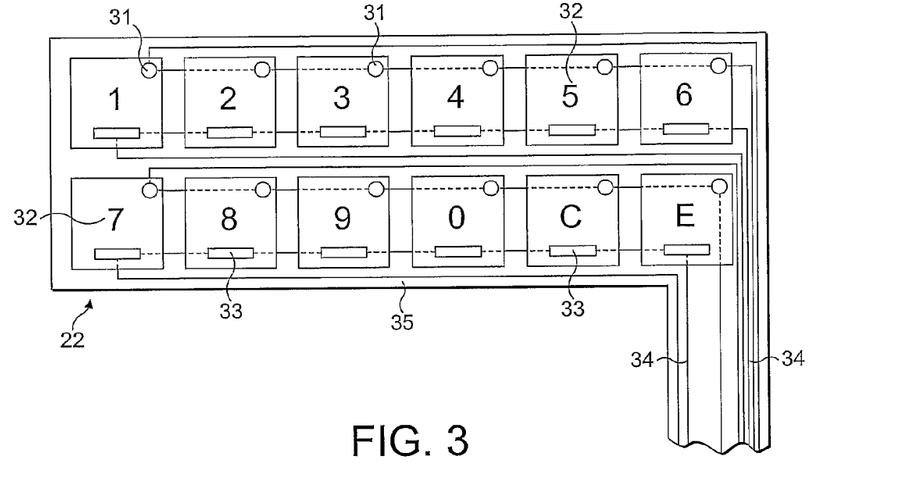
FIG. 3 is a detailed view of a part of the glazing shown in FIGS. 1 and 2.

FIG. 3 affords more detail about indication means 22, which is actually in the form of a keypad comprising twelve "buttons" 32, in the form of icons which are printed onto substrate 35, in the form of a piece of PET. Buttons 32 comprise individual icons for the numbers zero through to nine and the letters C (representing the function "cancel") and E (representing the function "enter"). Each button 32 is configured such that when indication means 22 is incorporated into glazing 10, each lies in register with a switch interface 21a. A stacked configuration is present for the indication means 22, switch interface 21a and icons. Each button 32 comprises visual indicator 31, in the form of an LED (which may emit light of any colour, subject to the availability of the corresponding LED), to indicate successful interaction with the corresponding switch interface 21a, and illumination means 33, also in the form of an LED (typically emitting a yellow/white light), to illuminate each button 32 in readiness for a user interacting with the corresponding switch interface 21a. Power is supplied to the LEDs via control electronics 15 through conductors 34, in the form of tracks of silver-based ink that has been printed onto substrate 35. A keypad is most suited for use when functional element 16 is in the form of a vehicle locking/unlocking mechanism—a correct sequence of numbers must be entered onto the keypad and recognised by control electronics 15 before the latter instructs the locking mechanism to lock/unlock the vehicle.

Figure 4:
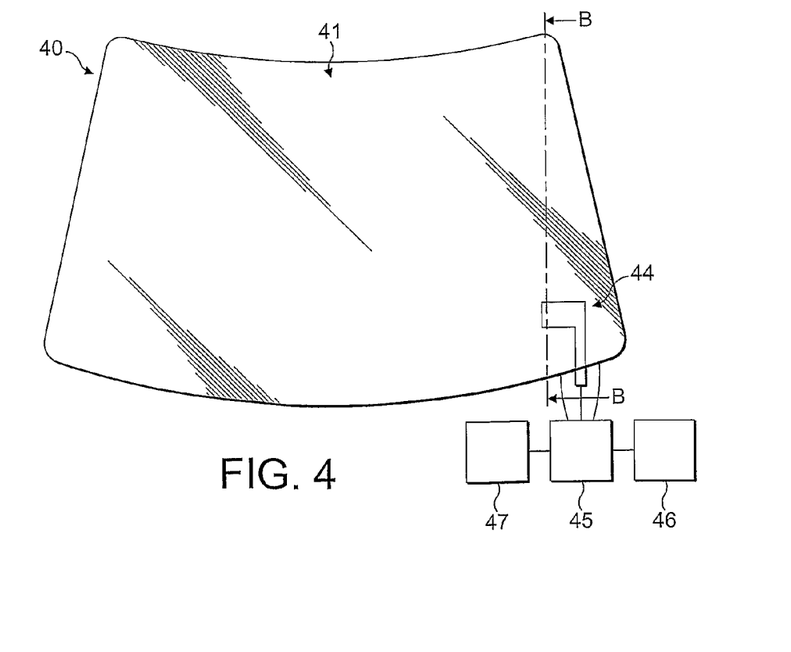
FIG. 4 is a plan view of a laminated glazing according to a second embodiment of the invention.
Figure 5:
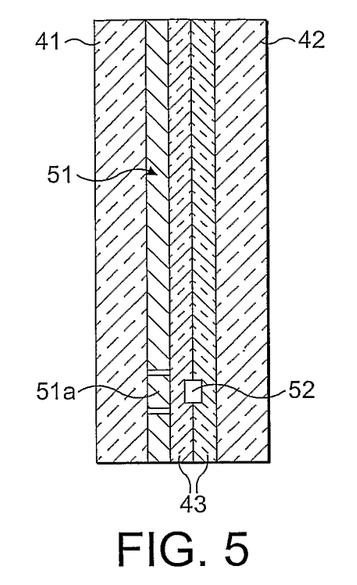
FIG. 5 is a cross section viewed along line B-B of FIG. 4.

FIGS. 4 and 5 show a laminated glazing 40 that is similar to glazing 10 shown in FIGS. 1 and 2, in that glazing 40 comprises outer pane of glazing material 41 and inner pane of glazing material 42, each in the form of a pane of glass, which are joined together via plies of interlayer material 43, in the form of plies of PVB. Glazing 40 further comprises switch arrangement 44, which is adapted to activate/deactivate a functional element 46 associated with the vehicle and is provided between panes of glazing material 41,42. Functional element 46 may be an item selected from the same list as given earlier. Switch arrangement 44 is electrically connected to functional element 46 via control electronics 45, the power to both of which is provided by power source 47, e.g. the vehicle's battery. Control electronics 45 is again chosen to cooperate with functional element 46 from suitable electronics known in the art.

Glazing 40 differs from glazing 10 in that the former is in the form of a vehicle windshield. Furthermore, outer pane of glazing material 41 is provided on its inner surface (the surface facing into the centre of glazing 40, known in the field as surface 2 (surface 1 being the outermost surface of a laminated glazing and surface 4 being the innermost)) with electrically conductive coating film 51, in the form of a double silver layer coating. Selected areas of the coating have been removed to form switch interface 51a, in the form of a discrete area or patch of coating on pane of glazing material 41. Switch interface 51a is operable from both sides of the glazing because glazing 40 does not include a driven shield (inclusion of a driven shield, of the type described in relation to FIGS. 1 and 2, would make switch interface 51a unidirectional in operation).

Figure 6:
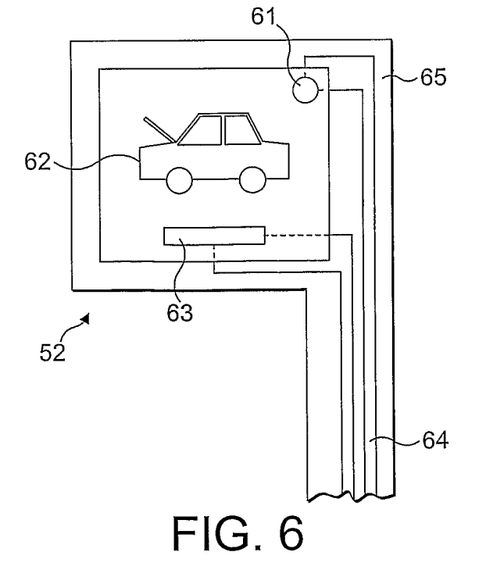
FIG. 6 is a detailed view of a part of the glazing shown in FIGS. 4 and 5.

Switch arrangement 44 comprises, in addition to switch interface 51a, indication means 52, which is provided between the two plies of interlayer material 43, in register with switch interface 51a. Insulation layer 53 is included within glazing 40 between switch interface 51a and indication means 52 to ensure the two associated electrical circuits remain electrically isolated from one another. FIG. 6 affords more detail about indication means 52, which is actually in the form of a "button" 62, in the form of an icon, representing a vehicle bonnet release mechanism, which is printed onto substrate 65, in the form of a piece of PET. The purpose of such an icon is to indicate to a vehicle user the location on the glazing that needs to be interfaced with in order to activate/deactivate the switch arrangement and thereby the particular functional element of which the icon is representative. Button 62 is configured such that when indication means 52 is incorporated into glazing 40, it lies in register with the switch interface 51a. Button 62 comprises visual indicator 61, in the form of an LED (which may emit light of any colour, subject to the availability of the corresponding LED), to indicate successful interaction with the corresponding switch interface 51a, and illumination means 63, also in the form of an LED (typically emitting a yellow/white light), to illuminate button 62 in readiness for a user interacting with the corresponding switch interface 51a. Power is supplied to the LEDs via control electronics 45 through conductors 64, in the form of tracks of silver-based ink that has been printed onto substrate 65.

Figure 7:
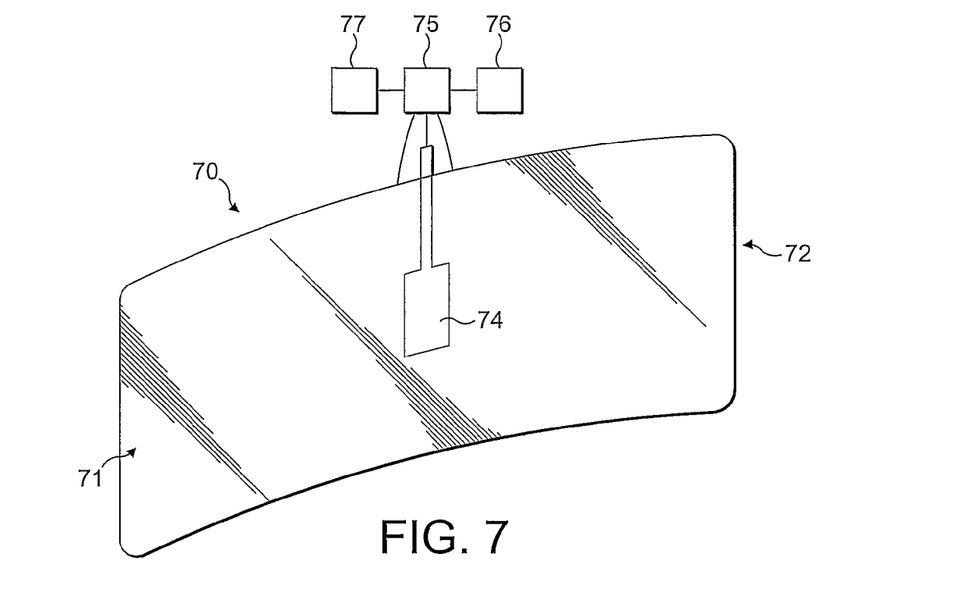
FIG. 7 is a plan view of a laminated glazing according to a third embodiment of the invention.

FIG. 7 shows a laminated glazing 70, in the form of a roof glazing, that is similar to glazings 10, 40, in that glazing 70 has the same basic construction (in terms of panes of glazing material 71,72, plies of interlayer material (not shown), switch arrangement 74, control electronics 75, functional element 76 and power source 77 as glazings 10,40. However glazing 70 is more similar to glazing 10 because it includes a driven shield (not shown) to make the switch interfaces (not shown) unidirectional. In this case, the switch interfaces are operable via the inner pane of glazing material 72 (and so from the inside of a vehicle into which glazing 70 may be fitted), thus avoiding their accidental activation. In this example, switch arrangement 74 is adapted to activate/deactivate functional element 76, which is in the form of a variable transmission mechanism, e.g. a liquid crystal film device or a suspended particle device.

Figure 8:
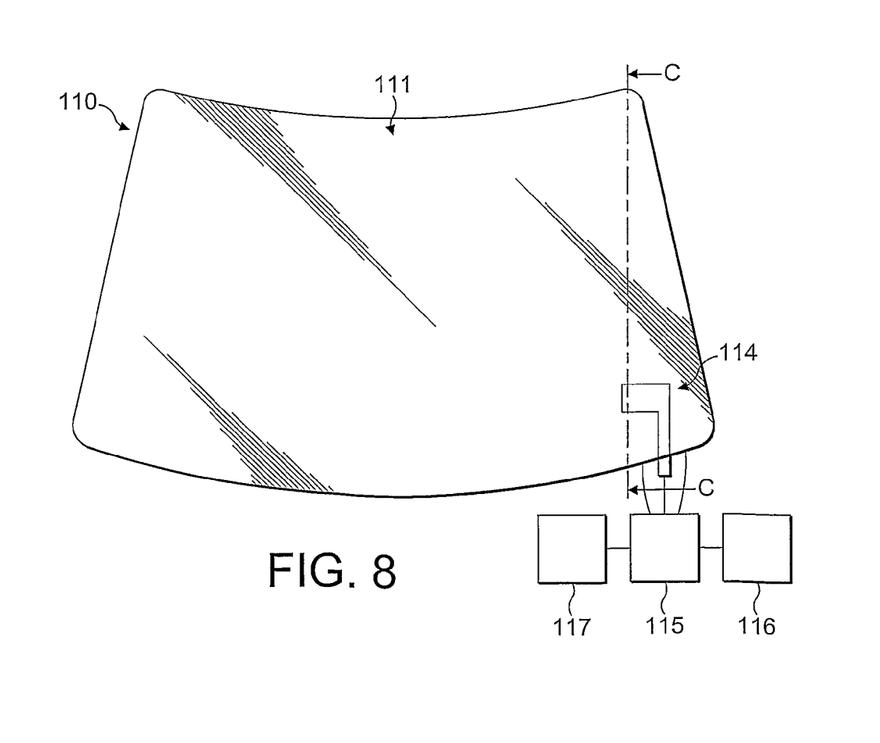
FIG. 8 is a plan view of a laminated glazing according to a fourth embodiment of the invention.
Figure 9:
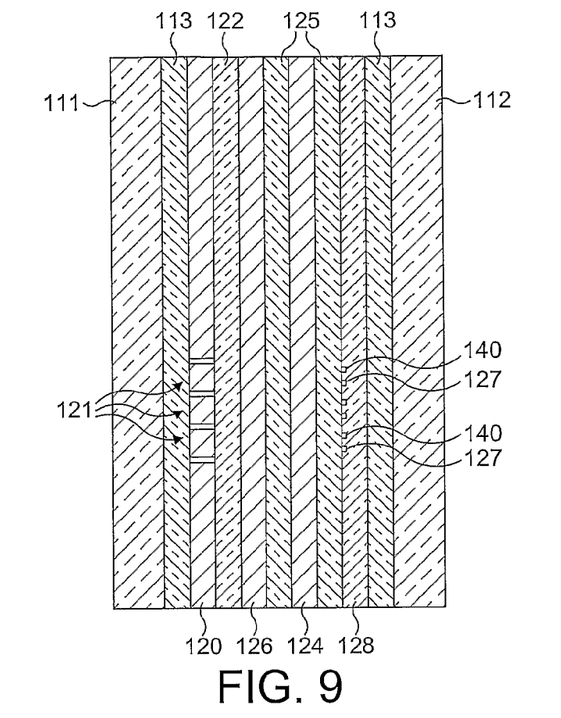
FIG. 9 is a cross section viewed along line C-C of FIG. 8.

Referring to FIGS. 8 and 9, there is shown a laminated glazing 110, in the form of a windshield glazing, which is suitable for fitting into an opening in the bodywork of a vehicle. Laminated glazing 110 comprises outer pane of glazing material 111 and an inner pane of glazing material 112 which are in the form of a pane of glass. The outer pane of glazing material 111 is joined to the inner pane of glazing material 112 via plies of interlayer material 113, in the form of plies of polyvinyl butyral (PVB). The laminated glazing 110 is further provided with switch arrangement 114 so as to operate from the outside of the vehicle one or more functional element 116 associated with the vehicle such as door lock, boot lock and/or automatic-release mechanism, fuel filler cap release.

Switch arrangement 114 includes switch interfaces 121 in the form of capacitive touch switches for detecting when an operator's hand is approaching or touching one of the capacitive switches. Each switch interfaces 121 is electrically connected to control electronics 115. The control electronics 115, powered by power source 117, control the operation of one or more functional elements 116. The control electronics 115 is provided remotely from the glazing, e.g. at a location somewhere on the vehicle itself such as on the inside of a door of the vehicle.

Switch arrangement 114 is a multilayer structure located between two of the plies of interlayer material 113 with alternating layers of conductive and insulating material to ensure that conductive layers remain electrically isolated from one another (as appropriate).

As can best be seen FIG. 9, switch arrangement 114 includes an electrically conductive coating 120, arranged on a carrier substrate 122 and adjacent to the inner surface of the ply 113, which is itself adjacent to the outer pane of glazing material 111. Coating 120 is printed so as to form switch interfaces 121 in the form of touch switches. Arranged successively adjacent to carrier substrate 122 is a guard electrode 126, a driven shield 124 and illumination means 127 arranged on a substrate 128. The driven shield 124, the guard electrode 126 and illumination means 127 are separated from each other by insulating layers 125.

The-carrier substrate 122 is composed of a clear plastic sheet on which is disposed for each switch interface 121a sensing electrode, in the form of a conductive coating film 120 such as a double silver layer.

Figure 10:
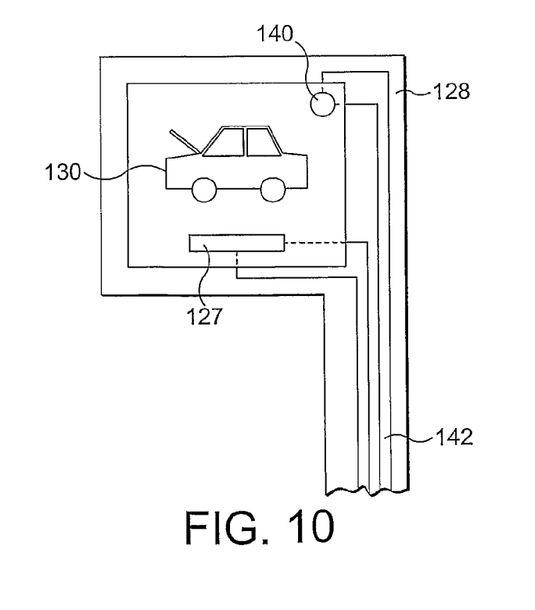
FIGS. 10 and 11 are detailed views of a part of the glazing shown in FIGS. 8 and 9.

An illumination legend, in the form of an icon 130, representing, for example, a vehicle bonnet release mechanism, is shown in FIG. 10. The illumination means 127 which in this example is in the form of an LED (typically emitting a yellow/white light) is arranged on the substrate 128 in such a way to illuminate the icon 130 in readiness for a user interacting with the switch interface 121.

The switch interface 121 further includes a visual indicator 140, in the form of an LED (which may emit light of any colour, subject to the availability of the corresponding LED), to indicate successful interaction with the switch interface 121. Power is supplied to the LEDs via control electronics through conductors 142, in the form of tracks of silver-based ink that has been printed onto substrate 128.

The driven shield 124 is driven with a signal identical to, but isolated from, the signal imposed on the or each switch interface 121 thus inhibiting capacitive interaction between a vehicle user inside the vehicle and the or each switch interface 121.

Figure 11:
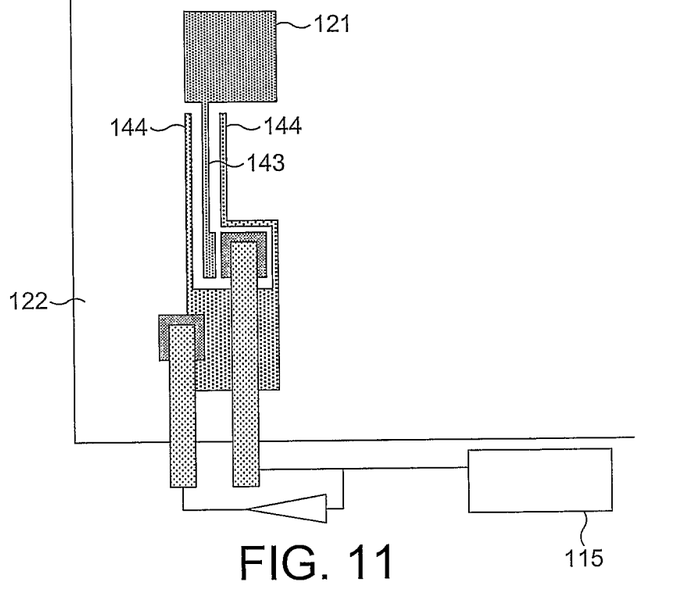

Referring to FIG. 11 for more detail about switch interfaces 121, the or each switch interface 121 is electrically connected to the control electronics 115 via conductors 143 bound to the carrier substrate 122. The control electronics 115 have a capacitance measuring means including, in a known manner, a frequency generator, a threshold circuit, a multiplexer and amplifier. Each conductor 143 is located between a pair of shield conductors 144 (guard electrodes) which are driven with a signal identical to, but isolated from the signal imposed on each switch interface 121 and thus corresponding conductor 143. Alternatively, the shield conductors 144 are connected to ground. The shield conductors 144 are bound to the carrier substrate 122. The capacitive measuring means measures a capacitive signal at the or each switch interface 121 and control the operation of the functional element 116 when a change of capacitance signal is detected. When the operator's hand is approaching near the switch arrangement, a response is also provided by an illumination of the illumination means 127 on substrate 128 shown in FIGS. 9 and 10. Such illumination is especially useful at night-time when the icons to be interfaced with, in order to activate/deactivate a functional element 116, are obscured or semi-obscured by darkness and so difficult to see by the vehicle user. The illumination means 127 is automatically deactivated after a predetermined period of time has elapsed. This period of time varies depending on whether the switch arrangement has been interfaced with, or if the glazing was illuminated accidentally. If the glazing has been touched, illumination may last for a period of fifteen seconds (preferably at least ten seconds), but if a switch interface is subsequently interfaced with in this period, illumination may be automatically deactivated in response. It would be appreciated that if the user touches the glazing within the vicinity of one of the conductors 143, the corresponding switch interface 121 will not be activated since the shield conductors 144 inhibit capacitive interaction within each conductor 143.

In a modification, the switch arrangement 114 comprises a wireless receiver, for instance an electromagnetic radiation, which activates the or each switch interface when a predetermined signal transmitted from a co-operable transmitter is received by it, prior to the or each switch interface being enabled to activate/deactivate the one or more functional elements. The receiver is operable by moving the transmitter into proximity with it, at which point the transmitted signal is received, recognised and accepted. The switch arrangement is not operable if it does not receive said signal from the transmitter. The transmitted signal effectively "wakes" the or each switch interface in readiness for interfacing with by a vehicle user. Furthermore, as a security feature, only a person in possession of the transmitter is able to interface with the switch arrangement. Once a vehicle into which a glazing according to the invention has been fitted is unlocked or has its ignition turned on however, the switch arrangement is then enabled for use by any person (use then being independent of the receiver/transmitter functionality). The switch arrangement is connected to an electromagnetic radiation receiver so as to activates the or each switch interface when a predetermined signal transmitted from a co-operable transmitter is received by it, prior to the or each switch interface being enabled to activate/deactivate the one or more functional elements.

Figure 12:
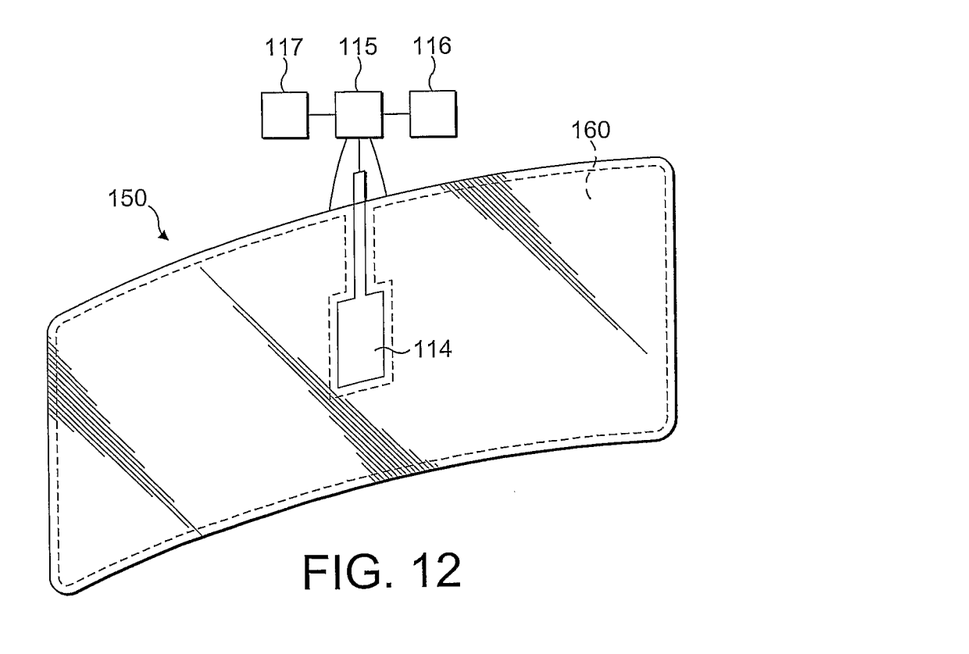
FIG. 12 is a plan view of a laminated glazing according to a fifth embodiment of the invention.

An alternative embodiment of the switch arrangement is shown in FIG. 12 in which the laminated glazing 150 is in the form of a roof glazing, the multilayer structure of the switch arrangement described in FIGS. 8 to 10 is inverted so that the guard electrode 126 (not shown in FIG. 12) is arranged in such a way to inhibit capacitive interaction between a vehicle user outside the vehicle and the or each switch interface 121. In this example the switch interface can operate one of the following non-exhaustive group: windshield heating element (for demisting and/or de-icing the windshield), windshield wipers, windshield washers, vehicle occupant's interior map/reacting light, rear window sunblind, rear window heating element, sun-roof open/close mechanism, sun-roof variable transmission mechanism, climate control system, air conditioning, seat heater, rear seat occupant's entertainment controls (e.g. for in-vehicle TV and/or DVD systems), interior light, in-vehicle telematics (e.g. GPS) and the like.

In a further alternative embodiment of the switch arrangement 114, the switch arrangement comprises a plurality of switch interfaces, which form a keypad for causing activation/deactivation of a functional element when a predetermined combination of keystrokes is entered onto it. Each switch interface comprises individual icon for the numbers or/and letters. Such a keypad is most suited for use when functional element 116 is in the form of a vehicle locking/unlocking mechanism—a correct sequence of numbers must be entered onto the keypad and recognised by control electronics 115 before the latter instructs the locking mechanism to lock/unlock the vehicle.

Although the invention has been described by way of example with reference to specific glazing, various modifications may be made without departing from the invention. For instance a functional coating such as a solar control coating may be provided on a surface of at least one of the panes. In addition, the illumination means may be provided as one or more LEDs. Furthermore, the illumination means may be activated by touching any part of the glazing (other than the or each switch interface) relative to which the switch arrangement is mounted by adding a sensing electrode 160 covering all the surface of the glazing as shown in FIG. 12.

Figure 13:
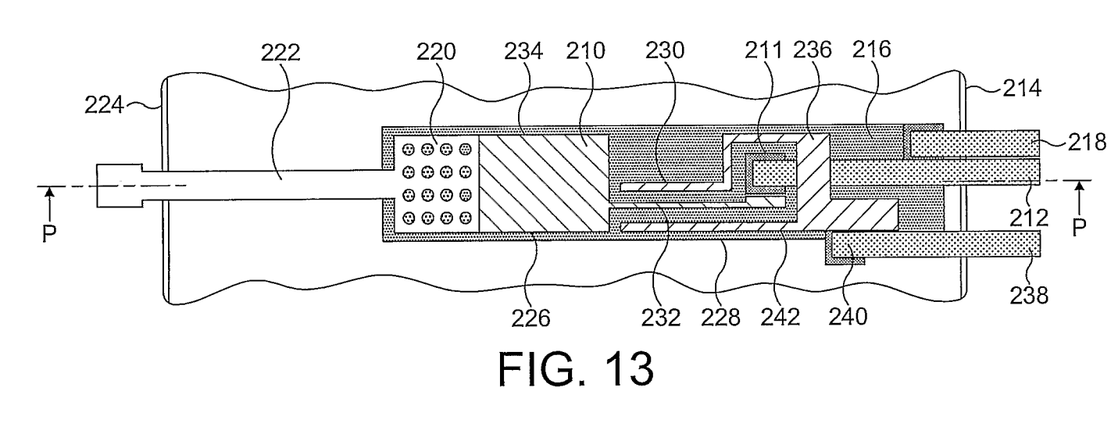
FIG. 13 is a plan view of a laminated glazing according to a sixth embodiment of the invention.
Figure 14:
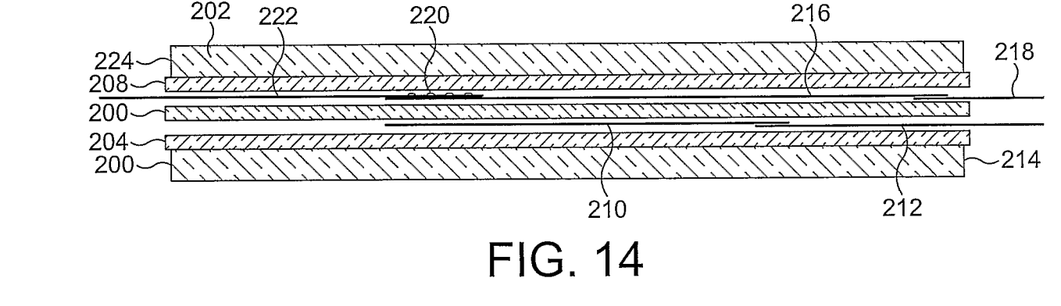
FIG. 14 is a cross section viewed along line D-D of FIG. 13.

A further embodiment of a vehicle glazing of the present invention is shown in FIGS. 13 and 14. The two glazing panes 200, 202, for example of glass, are laminated together by three interlayers 204, 206, 208, for example of PVB. A first glazing pane 200, which is adapted to be fitted to the vehicle on the side that the switch arrangement is to be manually operated, has a first interlayer 204 laminated thereto. One or more switch interface 210, formed by a metal film, such as a silver film, is laminated between the first interlayer 204 and a second, adjacent, interlayer 206. An electrical connector 212 attached to the switch interface 210 at a connection point 211 extends, between the interlayers 204, 206, to an edge 214 of the vehicle glazing.

A driven shield 216, formed by a metal film, such as a silver film, is laminated between the second interlayer 206 and a third, adjacent, interlayer 208. An electrical connector 218 (not shown in FIG. 13) attached to the shield 216 extends, between the interlayers 206, 208, to the edge 214 of the vehicle glazing.

An array of LEDs 220 (although only one LED 220 may be provided) is disposed on a surface of the shield 216 on a side thereof that is remote from the switch interface 210. Electrical connectors 222 attached to the array of LEDs 220 extend, between the interlayers 206, 208, to an opposite edge 224 of the vehicle glazing.

In this way, the shield 216 is sandwiched between the LEDs 220 and the switch interface 210. This ensures that the operation of the LEDs 220 does not affect the reliable operation of the switch interface 210 because the electrically driven shield 216 electrically isolates the LEDs from the switch interface 210. In addition, the shield 216, and correspondingly the LEDs 220 adjacent thereto, are separated from the switch interface 210 by a separation distance in a direction through the thickness of the laminated vehicle glazing, the separation distance substantially corresponding to the thickness of the second interlayer 206. This is because the shield 216 and the switch interface 210 are disposed on opposed surfaces of the second interlayer 206. Typically, the separation distance is at least 100 µm.

In plan, the shield 216 and the switch interface 210 are substantially in registry. The shield 216 has an area in the plane of the vehicle glazing that extends beyond an area of the switch interface 210. This can provide, as shown in FIG. 13, that the area of the shield 216 has an outwardly extending peripheral band 226 that extends beyond the area of the switch interface 210. This assists ensuring that the shield 216 acts to provide only unidirectional manual actuation of the switch interface 210, by a user's hand adjacent to or contacting the glazing pane 200 in the vicinity of the switch interface 210, and to provide isolation of the switch interface 210 from the operation of the LEDs 220. Typically, the peripheral band 226 has a width that is equal to or greater than a thickness of at least one of the two glazing panes, for example the glazing pane 200.

In this embodiment, the shield 216 also is substantially in registry with the electrical connector 212 attached to the switch interface 210. This ensures reliable operation of the switch interface 210 and its associated electrical connector 212.

Furthermore, the metal layer forming the switch interface 210 also has two legs 228, 230, separate and electrically isolated from the switch interface 210, on opposite sides of a central arm 232 that extends from a main plate 234 of the switch interface 210 to the connection point 211. The two legs 228, 230 are electrically connected together at a common end 236 that is electrically connected to an electrical connector 238 at a connection point 240. The electrical connector 238 can be electrically connected to the electrical connector 218 for the shield 216. Therefore the legs 228, 230 form an auxiliary shield element 242, connected to the shield 216, for the switch interface 210, in particular for the portion of the sensor provided to connect the sensor to the control electronics.

In a modification of this embodiment, the LEDs 220 are disposed on the opposite surface of the shield 216, that is on the surface of the shield 216 on a side thereof that is towards the switch interface 210.

Activation/deactivation of a functional element associated with the vehicle may be in the form of an on/off mechanism, an open/close mechanism, an increase/decrease mechanism (which may be in the form of a graduated scale), and/or other such like mechanisms as may be required. Interaction with the or each switch interface may therefore have the effect of turning on a functional element, or opening a functional element, or increasing/decreasing some quality/quantity of a functional element, etc.

The bodywork of a vehicle typically includes a number of window openings—a rear window, a front window, side windows and optionally a roof window (either in the form of a conventional sun-roof or a full-area roof). A glazing according to the invention is especially suitable for fitting into any of these openings. Furthermore two or more of the glazings to be fitted into window openings of the bodywork of a vehicle may each be provided with a switch arrangement, so that there may be a number of switch arrangements positioned around a vehicle. A glazing according to the invention is also suitable for fitting as an internal glazing panel in a vehicle, e.g. as a control panel between the front and rear seats of the vehicle.

The invention claimed is:

1. A laminated vehicle glazing comprising:
   at least two glazing panes laminated together by at least one interlayer therebetween;
   at least one sensor which is manually operable by the presence of a user's hand contacting or proximal to at least one of the panes;
   at least one electromagnetic shield associated with the at least one sensor to inhibit capacitive interaction between a vehicle user from one of inside and outside of the vehicle into which the glazing may be fitted such that the at least one sensor is manually operable by the presence of a user's hand from only one side of the vehicle glazing; and
   at least one connector electrically connected to the at least one sensor connectable to an external device for control of the external device by manual operation of the at least one sensor.

2. A laminated vehicle glazing according to claim 1 further comprising a visual indicator to indicate the location of the at least one sensor and/or the function of the external device; and at least one electrical illumination device, laminated between the at least two glazing panes, adapted to illuminate the visual indicator and/or to indicate manual operation of the external device.

3. A laminated vehicle glazing according to claim 2 wherein the visual indicator is printed on at least one of the glazing panes.

4. A laminated vehicle glazing according to claim 2 wherein the at least one electrical illumination device comprises at least one first electrical illumination device adapted to illuminate the visual indicator.

5. A laminated vehicle glazing according to claim 4 wherein the first electrical illumination device is located behind the visual indicator.

6. A laminated vehicle glazing according to claim 4 further comprising at least one second sensor connected to the at least one first electrical illumination device to cause actuation thereof and manually operable by the presence of a user's hand contacting or proximal to at least one of the panes.

7. A laminated vehicle glazing according to claim 4 wherein the at least one electrical illumination device further comprises at least one second electrical illumination device adapted to indicate manual operation of the switch.

8. A laminated vehicle glazing according to claim 2 wherein the at least one electrical illumination device and the at least one shield are commonly disposed between adjacent interlayers of the vehicle glazing.

9. A laminated vehicle glazing according to claim 1 wherein the at least one shield and the at least one sensor are separated by a separation distance in a direction through the thickness of the laminated vehicle glazing.

10. A laminated vehicle glazing according to claim 9 wherein the at least one electrical illumination device is separated from the at least one sensor by the separation distance in a direction through the thickness of the laminated vehicle glazing.

11. A laminated vehicle glazing according to claim 9 wherein the separation distance is at least 1 mm.

12. A laminated vehicle glazing according to claim 1 wherein the at least one shield and the at least one sensor are disposed on opposed surfaces of one of the at least one interlayer.

13. A laminated vehicle glazing according to claim 1 wherein the at least one shield and the at least one sensor are substantially in registry and the at least one shield has an area in the plane of the vehicle glazing that extends beyond an area of the at least one sensor.

14. A laminated vehicle glazing according to claim 13 wherein the area of the at least one shield has an outwardly extending peripheral band that extends beyond the area of the at least one sensor.

15. A laminated vehicle glazing according to claim 14 wherein the overlapping peripheral band has a width at least equal to a thickness of at least one of the two glazing panes.

16. A laminated vehicle glazing according to claim 1 wherein the at least one shield is substantially in register with the at least one connector.

17. A laminated vehicle glazing according to claim 1 wherein the at least one sensor and the at least one shield comprise a switch arrangement, adapted in use to activate/deactivate one or more external devices associated with the vehicle.

18. A laminated vehicle glazing according to claim 1 wherein the at least one sensor and the at least one shield form part of a capacitive circuit which in use is connected to control electronics in the vehicle for measuring a capacitive signal at the or each sensor and control the operation of the external device when a change of capacitive signal is detected.

19. A laminated vehicle glazing as claimed claim 18 wherein the at least one connector is arranged between two guard electrodes in such a way that no change in the capacitive signal can be detected at the at least one connector.

20. A laminated vehicle glazing as claimed in claim 1 wherein the at least one sensor comprises a plurality of switch interfaces, which form a keypad for causing activation/deactivation of a functional element when a predetermined combination of keystrokes is entered onto it.

21. A laminated vehicle glazing as claimed in claim 1 wherein the at least one sensor is arranged to face into the interior of a vehicle, for operation by an occupant of the vehicle.

22. A laminated vehicle glazing as claimed in claim 1 wherein the at least one sensor is arranged to face the exterior of a vehicle, for operation by a user outside the vehicle.

23. Use of a laminated vehicle glazing as claimed in claim 1 as a windshield, rear window glazing, side window glazing or roof glazing of a vehicle.

24. A motor vehicle comprising a bodywork and having fitted into the bodywork at least one laminated glazing according to claim 1, the vehicle further comprising control electronics for the at least one sensor and the at least one electrical illumination device.

25. A vehicle as claimed in claim 24 wherein at least one sensor is connected to a wireless receiver so as to activate the or each sensor when a predetermined signal transmitted from a co-operable transmitter is received by it, prior to the or each sensor being enabled to activate/deactivate the external device.

26. A vehicle as claimed in claim 24 wherein the laminated vehicle glazing further comprises a visual indicator to indicate the location of the at least one sensor and/or the function of the external device; and at least one electrical illumination device, laminated between the at least two glazing panes, adapted to illuminate the visual indicator and/or to indicate manual operation of the external device, and wherein the at least one electrical illumination device is activated by operation of the at least one sensor.

27. A vehicle as claimed in claim 26 wherein the at least one electrical illumination device is automatically deactivated after a predetermined period of time has elapsed following activation.

28. A vehicle as claimed in claim 24 wherein activation/deactivation of the one or more external devices is in the form of an on/off mechanism, an open/close mechanism and/or an increase/decrease mechanism.

29. A laminated vehicle glazing comprising:
- at least two glazing panes laminated together by at least one interlayer therebetween;
- at least one sensor which is manually operable by the presence of a user's hand contacting or proximal to at least one of the panes;
- at least one connector electrically connected to the at least one sensor and connectable to an external device for control of the external device by manual operation of the at least one sensor;
- a visual indicator to indicate the location of the at least one sensor and/or the function of the external device; and
- at least one electrical illumination device, laminated between the at least two glazing panes, adapted to illuminate the visual indicator and/or to indicate manual operation of the external device,
- wherein the at least one sensor, the visual indicator and the at least one electrical illumination device are in registry together in a stacked configuration.

30. A laminated vehicle glazing comprising:
- at least two glazing panes laminated together by at least one interlayer positioned between the at least two glazing panes;
- at least one sensor manually operable by presence of a user's hand contacting or proximal to at least one of the panes;
- at least one connector electrically connected to the at least one sensor and connectable to an external device to control the external device by manual operation of the at least one sensor; and
- at least one electromagnetic shield associated with the at least one sensor to inhibit capacitive interaction between a vehicle user from one of inside and outside of the vehicle into which the glazing may be fitted so that the sensor is unidirectionally operational permitting manual operation of the at least one sensor from one side of the vehicle glazing and not permitting manual operation of the at least one sensor from the opposite side of the vehicle glazing.

* * * * *